United States Patent
Chou et al.

(10) Patent No.: US 7,321,275 B2
(45) Date of Patent: Jan. 22, 2008

(54) ULTRA-LOW VOLTAGE CAPABLE ZIPPER SWITCH

(75) Inventors: Tsung-Kuan Allen Chou, San Jose, CA (US); Hanan Bar, Jerusalem (IL); Quan Tran, Fremont, CA (US); Joseph Melki, Efrata (IL); John Heck, Berkeley, CA (US); Qing Ma, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 233 days.

(21) Appl. No.: 11/165,795

(22) Filed: Jun. 23, 2005

(65) Prior Publication Data

US 2006/0290443 A1 Dec. 28, 2006

(51) Int. Cl.
*H01P 1/10* (2006.01)

(52) U.S. Cl. .................................... 333/105; 333/262

(58) Field of Classification Search ............... 333/262, 333/101, 105, 78; 200/181
See application file for complete search history.

(56) References Cited

U.S. PATENT DOCUMENTS

| | | | |
|---|---|---|---|
| 5,258,591 A | 11/1993 | Buck | |
| 6,686,820 B1 | 2/2004 | Ma et al. | |
| 6,812,810 B2 | 11/2004 | Ma et al. | |
| 6,812,814 B2 | 11/2004 | Ma et al. | |
| 6,875,936 B1 * | 4/2005 | Suzuki et al. | 200/181 |
| 6,876,482 B2 * | 4/2005 | DeReus | 359/290 |
| 6,880,235 B2 * | 4/2005 | Ma | 29/622 |
| 2002/0190267 A1 | 12/2002 | Robertson | |
| 2003/0020173 A1 | 1/2003 | Huff et al. | |
| 2003/0058069 A1 | 3/2003 | Schwartz et al. | |
| 2004/0000696 A1 | 1/2004 | Ma et al. | |
| 2004/0183148 A1 | 9/2004 | Blasko, III | |
| 2005/0007219 A1 | 1/2005 | Ma et al. | |
| 2005/0134413 A1 | 6/2005 | Bar et al. | |
| 2005/0219016 A1 | 10/2005 | Chou et al. | |
| 2005/0248424 A1 | 11/2005 | Chou et al. | |

(Continued)

FOREIGN PATENT DOCUMENTS

GB 2 353 410 A 2/2001

(Continued)

OTHER PUBLICATIONS

Park, Jae et al., "Electroplated RF MEMS Capacitive Switches," The Thirteenth Annual International Conference on MEMS 2000, Jan. 23-27, 2000, pp. 639-644.

(Continued)

*Primary Examiner*—Dean Takaoka
(74) *Attorney, Agent, or Firm*—Blakely, Sokoloff, Taylor & Zafman LLP (57) ABSTRACT

An electromechanical switch includes an actuation electrode, an anchor, a cantilever electrode, a contact, and signal lines. The actuation electrode and anchor are mounted to a substrate. The cantilever electrode is supported by the anchor above the actuation electrode. The contact is mounted to the cantilever electrode. The signal lines are positioned to form a closed circuit with the contact when an actuation voltage is applied between the actuation electrode and the cantilever electrode causing the cantilever electrode to bend towards the actuation electrode in a zipper like movement starting from a distal end of the cantilever electrode.

20 Claims, 9 Drawing Sheets

U.S. PATENT DOCUMENTS

| 2005/0285697 A1 | 12/2005 | Chou |
| 2006/0065942 A1 | 3/2006 | Chou et al. |
| 2006/0226501 A1 | 10/2006 | Chou |
| 2006/0289954 A1 | 12/2006 | Bar-Sadeh et al. |

FOREIGN PATENT DOCUMENTS

| WO | WO 97/18574 | 5/1997 |
| WO | WO 99/17322 | 4/1999 |
| WO | WO 2005/023699 A1 | 3/2005 |
| WO | WO 2005/104158 A1 | 11/2005 |
| WO | PCT/US2006/024724 | 11/2006 |

OTHER PUBLICATIONS

Shen, Shyh-Chiang et al., "Low Actuation Voltage RF MEMS Switches With Signal Frequencies From 0.25GHz to 40GHz," IEDM Technical Digest, 1999, pp. 689-692.

Pacheco, Sergio P. et al., "Design of Low Actuation Voltage RF MEMS Switch," IEEE MTT-S Digest, pp. 165-168, 2000.

U.S. Appl. No. 10/740,649, filed Dec. 18, 2003.

U.S. Appl. No. 10/812,900, filed Mar. 31, 2004.

U.S. Appl. No. 10/841,385, filed May 7, 2004.

U.S. Appl. No. 10/879,539, filed Jun. 29, 2004.

U.S. Appl. No. 10/955,153, filed Sep. 30, 2004.

Nishijima, N. et al., "A Low-Voltage High Contact Force RF-MEMS Switch," *IEEE MTT-S Digest* (2004), pp. 577-580.

International Search Report for PCT/US2006/046894 (filed Dec. 7, 2006), mailed May 14, 2007, (3 pages).

Written Opinion of the International Searching Authority for PCT/US2006/046894 (filed Dec. 7, 2006), mailed May 14, 2007 (5 pages).

* cited by examiner

FIG. 11

ULTRA-LOW VOLTAGE CAPABLE ZIPPER SWITCH

TECHNICAL FIELD

This disclosure relates generally to micro-electromechanical systems ("MEMS"), and in particular, relates to MEMS switches.

BACKGROUND INFORMATION

Micro-electromechanical systems ("MEMS") devices have a wide variety of applications and are prevalent in commercial products. One type of MEMS device is a MEMS radio frequency (RF) switch. A typical MEMS RF switch includes one or more MEMS switches arranged in an RF switch array. MEMS RF switches are ideal for wireless devices because of their low power characteristics and ability to operate in radio frequency ranges. MEMS RF switches are well suited for applications including cellular telephones, wireless networks, communication systems, and radar systems. In wireless devices, MEMS RF switches can be used as antenna switches, mode switches, transmit/receive switches, and the like.

Known MEMS switches use an electroplated metal cantilever supported at one end and having an electrical RF contact near the distal end of the metal cantilever. An actuation electrode is positioned below the electrical RF contact and a direct current ("DC") actuation voltage applied to either the actuation electrode or the metal cantilever forcing the metal cantilever to bend downward and make electrical contact with a bottom RF signal trace. Once electrical contact is established, the circuit is closed and an RF signal superimposed over the DC actuation voltage can pass through the metal cantilever to the actuation electrode and/or to the bottom RF signal trace.

These MEMS switches typically require 40 V or more actuation voltage. If the actuation voltage is reduce much below 40 V, then the spring constant of the cantilever must be reduced. These lower voltage MEMS switches suffer from "stiction" (i.e., stuck in a closed circuit position) and tend to be self-actuated by RF signals or vibrations due to their ultra low spring constants. During fabrication, the electroplated metal cantilever suffers from high stress gradients and therefore has a tendency to curl upwards at the distal end, referred to as switch beam bending. Accordingly, the actuation voltage must be sufficiently large to overcome the larger separation distance due to beam bending and induce electrostatically collapsing contact between the metal cantilever and the actuation electrode below. Furthermore, during high speed switching operation, known MEMS switches suffer from frequency limiting, air damping resistance.

BRIEF DESCRIPTION OF THE DRAWINGS

Non-limiting and non-exhaustive embodiments of the invention are described with reference to the following figures, wherein like reference numerals refer to like parts throughout the various views unless otherwise specified.

DETAILED DESCRIPTION

Embodiments of a micro-electromechanical system ("MEMS") zipper switch and systems thereof are described herein. In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 1A:
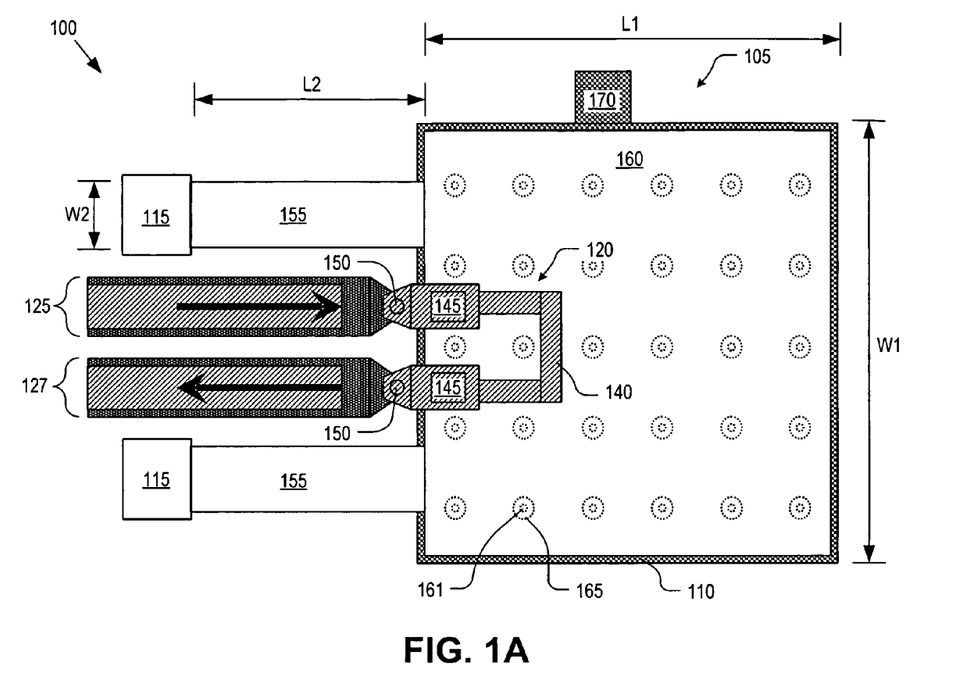
FIG. 1A is a schematic diagram illustrating a plan view of a zipper switch, in accordance with an embodiment of the invention.
Figure 1B:
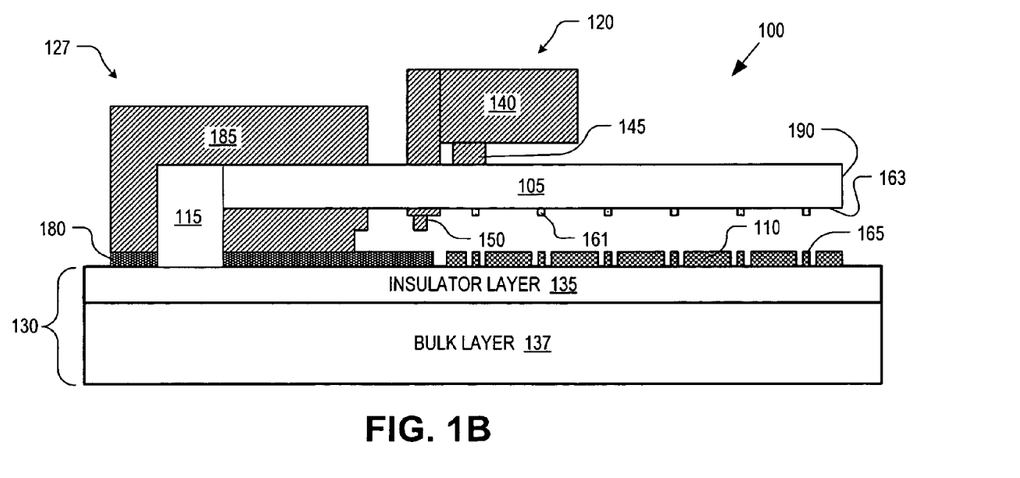
FIG. 1B is a schematic diagram illustrating a cross-sectional view of a zipper switch, in accordance with an embodiment of the invention.

FIGS. 1A and 1B are schematic diagrams illustrating a zipper switch 100, in accordance with an embodiment of the invention. FIG. 1A is a plan view of zipper switch 100 while FIG. 1B is a cross-sectional view of the same. It should be appreciated that the figures herein are not drawn to scale, but rather are merely intended for illustration.

The illustrated embodiment of zipper switch 100 includes a cantilever electrode 105, an actuation electrode 110, anchors 115, a contact 120, an input signal line 125 and an output signal line 127. Zipper switch 100 is mounted on a substrate 130, which includes an insulating layer 135 and a bulk layer 137. The illustrated embodiment of contact 120 includes a suspended trace 140, trace mounts 145, and protruding contacts 150. The illustrated embodiment of cantilever electrode 105 includes narrow members 155 and a plate member 160. Plate member 160 further includes stopper stubs 161 formed on an underside 163. Stopper butts 165 are defined within actuation electrode 110, but electrically insulated therefrom and positioned to abut stopper stubs 161 when cantilever electrode 105 collapses onto actuation electrode 110. Actuation electrode 110 includes an input port 170 for applying an actuation voltage between actuation electrode 110 and cantilever electrode 105 to induce electrostatic zipper collapse of cantilever electrode 105. Signal lines 125 and 127 each include a bottom electrode 180 and an upper layer 185. It should be appreciated that in some cases only one or two instances of a component/element have been labeled so as not to crowd the drawings.

Substrate 130 may be formed using any material including various semiconductor substrates (e.g., silicon substrate). Insulator layer 135 is provided as a dielectric layer to insulate bottom electrode 180 and actuation electrode 110 from each other and from bulk layer 137. If bulk layer 137 is an intrinsic insulator then embodiments of the invention may not include insulator layer 135. Although not illustrated, bulk layer 137 may include a number of sub-layers having signal traces or components (e.g., transistors and the like) integrated therein and electrically coupled to any of signal lines 125 or 127, anchors 115, or actuation electrode 110. In an embodiment where bulk layer 137 includes silicon, insulator layer 135 may include a layer of silicon nitride approximately 0.25 µm thick.

In one embodiment, signal lines 125 and 127 are formed on insulator layer 135 to propagate radio frequency ("RF") signals. However, it should be appreciated that embodiments of zipper switch 100 may be used to switch other frequency signals including direct current ("DC") signals, low frequency signals, microwave signals, and the like. Bottom electrode 180 and upper layer 185 may be formed using any conductive material, including metal, such as gold (Au). In one embodiment, bottom electrode is approximately 20 µm to 60 µm wide and 0.3-0.5 µm thick, while upper layer 185 is approximately 6 µm thick.

Actuation electrode 110 is formed on insulator layer 135 to form a bottom electrode for actuating cantilever electrode 105 and turning on/off zipper switch 100. Actuation electrode 110 may be formed of any number of conductive materials, including polysilicon. Input port 170 may also be fabricated of polysilicon and is coupled to actuation electrode 110 to switchably apply the actuation voltage thereto. In one embodiment, actuation electrode 110 has a width W1 (e.g., ≈200 µm) and a length L1 (e.g., ≈200 µm) and a thickness of approximately 0.1-0.2 µm. As illustrated, a number of stopper butts 165 are interspersed within actuation electrode 110. In the illustrated embodiment, stopper butts 165 are electrically insulated from actuation electrode 110 by an air gap (e.g., ≈2-3 µm).

As mentioned above, the illustrated embodiment of cantilever electrode 105 includes three members: two narrow members 155 and plate member 160. Narrow members 155 are mounted to anchors 115, which in turn mount cantilever electrode 105 to substrate 130 over actuation electrode 110. In one embodiment, cantilever electrode 105 is fabricated using low stress gradient ("LAG") polysilicon. LAG polysilicon can be processed without severe upward curling of cantilever electrode 105. In other words, during fabrication of cantilever electrode 105 using a LAG polysilicon material, cantilever electrode 105 remains relatively parallel to substrate 130 along its length (e.g., less than 25 nm of bending over 350 µm span of cantilever electrode 105) and therefore distal end 190 experiences relatively minor or no upward curling.

Cantilever electrode 105 may be fabricated by first defining actuation electrode 110 and anchors 115 on substrate 130, then forming a sacrificial layer (e.g., deposited oxide) over actuation electrode 110 to fill the air gap between cantilever electrode 105 and actuation electrode 110. Next, cantilever electrode 105 may be formed over the sacrificial layer and anchors 115 and contact 120 formed thereon. Subsequently, the sacrificial layer may be etched away with an acid bath (e.g., hydrofluoric acid) to free the bendable cantilever electrode 105.

In one embodiment, plate member 160 has approximately the same dimensions, length L1 and width W1, as actuation electrode 110 (perhaps slightly smaller in some embodiments) and narrow members 155 have a width W2 (e.g., ≈30-60 µm) and a length L2 (e.g., ≈50-150 µm). In one embodiment, cantilever electrode 105 is approximately 2-4 µm thick. It should be appreciated that other dimensions may be used for the above components.

Stopper stubs 161 are formed on underside 163 of plate member 160 to prevent cantilever electrode 105 from collapsing directly onto actuation electrode 110 and forming an electrical connection thereto. If cantilever electrode 105 were to form electrical connection with actuation electrode 110 while zipper switch 100 is closed circuited, then the actuation voltage between the two electrode would be shorted, and zipper switch 100 would open. Further, allowing actuation electrode 110 and cantilever electrode 105 to short circuit results in needless and harmful power dissipation. Accordingly, stopper stubs 161 are positioned on underside 163 to align with the insulated stopper butts 165 so as to prevent an electrical connection between cantilever electrode 105 and actuation electrode 110.

In one embodiment, anchor 115 supports cantilever electrode 105 approximately 0.5-2.0 µm above actuation electrode 110. Since polysilicon is a relatively hard substance and due to the multi spring constant nature of cantilever electrode 105 (discussed in detail below) and stopping functionality of stopper stubs 161, very small separation distances between cantilever electrode 105 and actuation electrode 110 can be achieved (e.g., 0.6 µm or less). Due to the small air gap between cantilever electrode 105 and actuation electrode 110 and the low curling properties of LAG polysilicon, an ultra-low actuation voltage (e.g., 3.0V actuation voltage) zipper switch 100 can be achieved.

The illustrated embodiment of contact 120 includes a suspended trace 140 mounted to cantilever electrode 105 via trace mounts 145. Suspended trace 140 may be coupled to dual protruding contacts 150 that extend below cantilever electrode 105 to make electrical contact with bottom electrode 180 when zipper switch 100 is closed circuited. In one embodiment, contact 120 is fabricated of metal, such as gold (Au). In one embodiment, a insulating layer is disposed between trace mounts 145 and cantilever electrode 105; however, since trace mounts 145 are relatively small and suspended trace 140 is fabricated of metal being substantially more conductive than cantilever electrode 105, the insulating layer may not be included in some embodiments (as illustrated). In one embodiment, suspended trace 140 is approximately 10 µm wide and 6 µm thick.

Contact 120 may be mounted to cantilever electrode 105 closer to anchors 115 than to distal end 190. In other words, contact 120 may be positioned between anchors 115 and a center of cantilever electrode 105. Positioning contact 120 closer to anchors 115 than to distal end 190 helps prevent stiction and false switching due to self-actuation or vibrations, as is discussed below.

It should be appreciated that a number of modifications may be made to the structure of zipper switch 100 illustrated in FIGS. 1A and 1B within the spirit of the present invention. For example, a single anchor 115 and single narrow member 155 may be used to suspend a smaller plate member 160 above actuation electrode 110. In this alternative embodiment, protruding contacts 150 may straddle each side of this single narrow member 155. In yet another embodiment, a single protruding contact 150 may be used to make bridging contact with both signal lines 125 and 127. In yet other embodiments, the specific shapes of cantilever electrode 105 and actuation electrode 110, as well as other components, may be altered.

Figure 2:
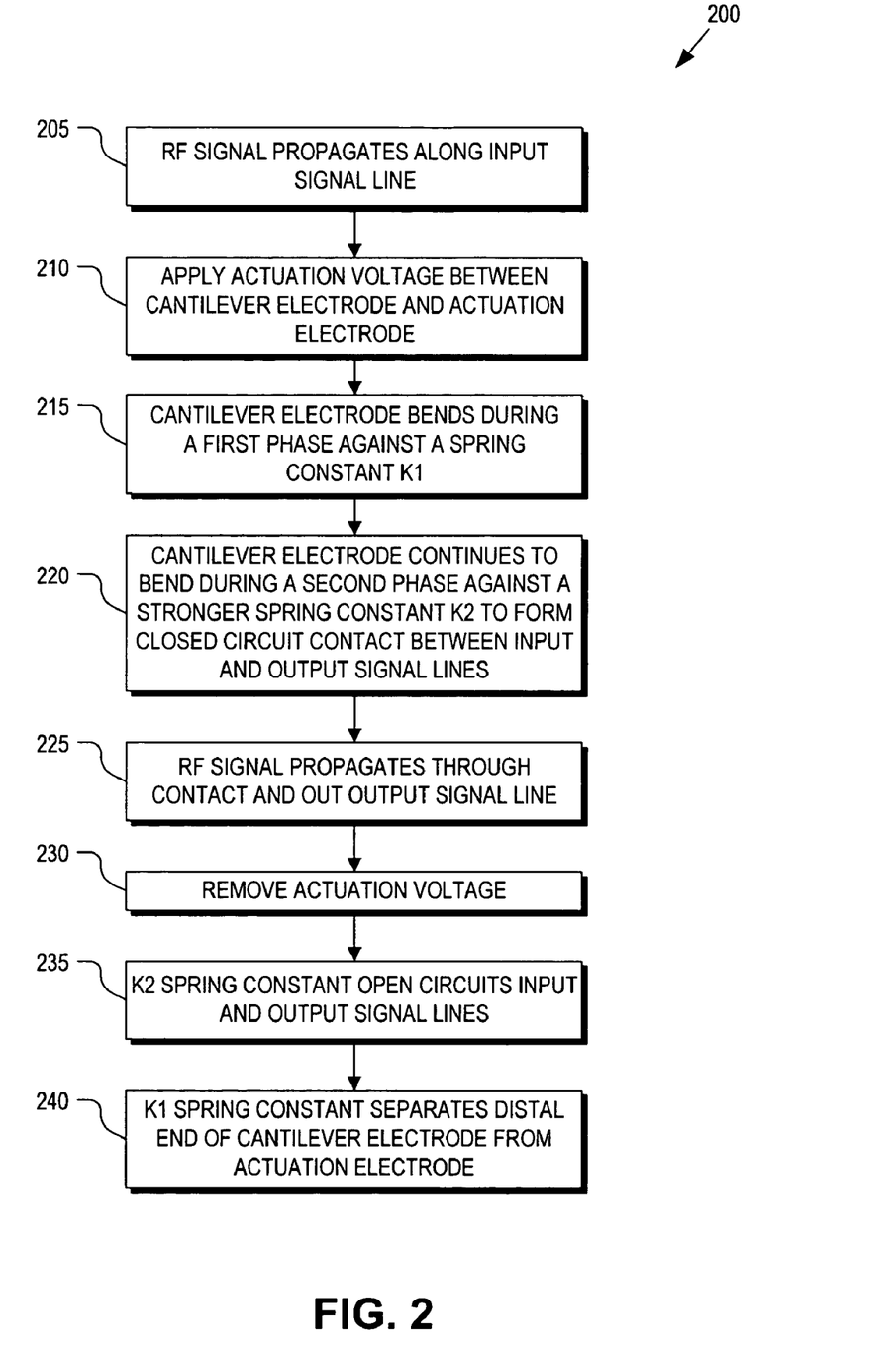
FIG. 2 is a flow chart illustrating a process of operation of a zipper switch, in accordance with an embodiment of the invention.

FIG. 2 is a flow chart illustrating a process 200 for operation of zipper switch 100, in accordance with an embodiment of the invention. In should be appreciated that the order in which some or all of the process blocks appear in process 200 should not be deemed limiting. Rather, one of ordinary skill in the art having the benefit of the present disclosure will understand that some of the process blocks may be executed in a variety of orders not illustrated.

In a process block 205, an RF signal is propagated along input signal line 125. In a process block 210, an actuation voltage is applied between actuation electrode 110 and cantilever electrode 105. In one embodiment, cantilever electrode 105 is electrically grounded through anchors 115 and the actuation voltage is applied to actuation electrode 110 through input port 170. Alternatively, actuation electrode 110 may be grounded through input port 170 and the actuation voltage applied to cantilever electrode 105 through anchors 115.

Figure 4:
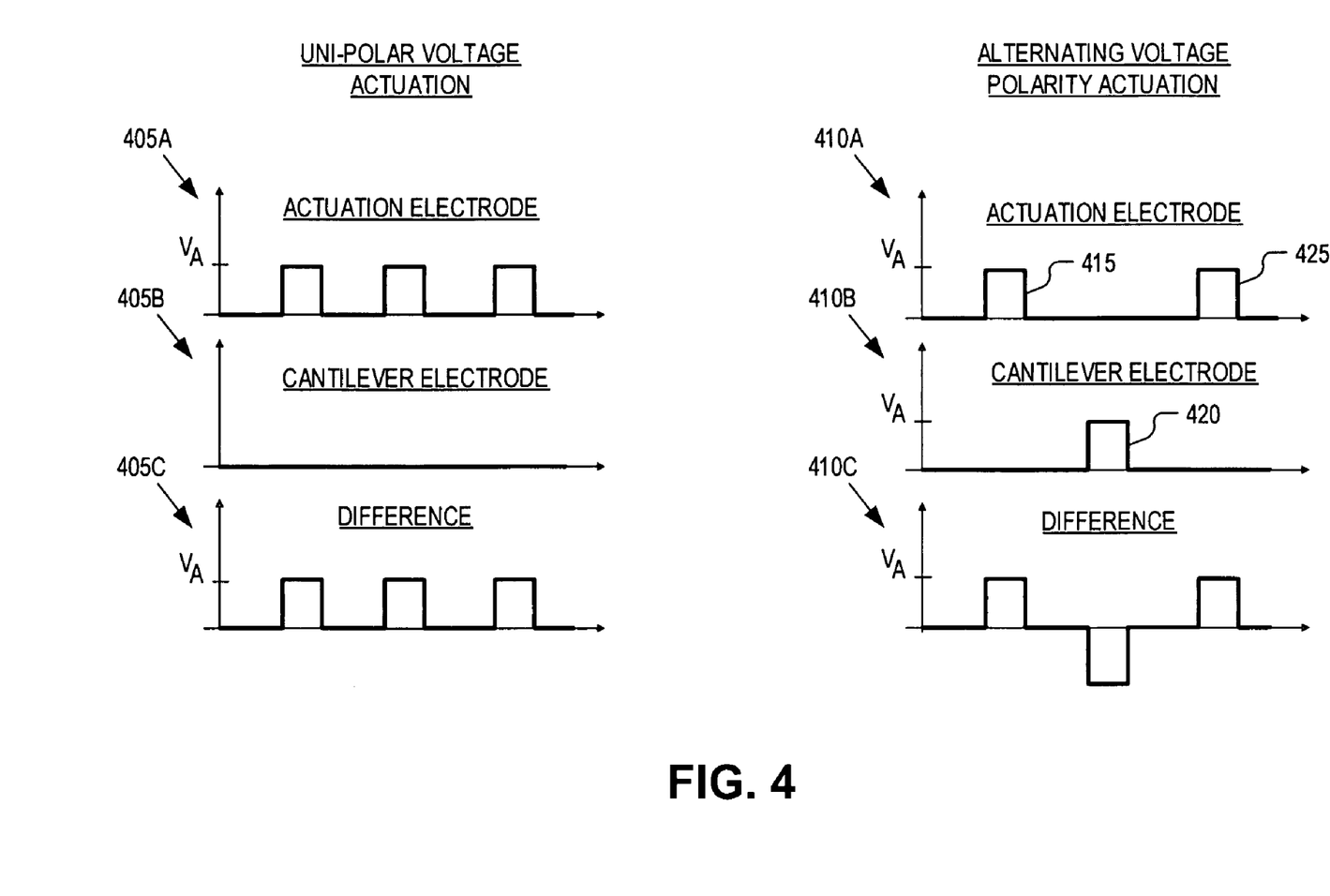
FIG. 4 illustrates line graphs of uni-polar voltage actuation and alternating polarity voltage actuation of a zipper switch, in accordance with an embodiment of the invention.

Referring to FIG. 4, either uni-polar voltage actuation (illustrated by line graphs 405A, B, C) or alternating voltage polarity actuation (illustrated by line graphs 410A, B, C) may be applied. Since cantilever electrode 105 and actuation electrode 110 are substantially electrically decoupled from the RF signal path (e.g., signal lines 125, 127 and contact 120), the polarity of the voltage actuation may be changed without affecting the RF signal. Line graph 405A illustrates three consecutive uni-polar actuations of zipper switch 100 wherein the actuation voltage $V_A$ is applied to actuation electrode 110. Line graph 405B illustrates the same three consecutive actuations wherein the voltage of cantilever electrode 105 remains grounded. Line graph 405C illustrates the voltage different between actuation electrode 110 and cantilever electrode 105.

Line graphs 410A and 410B illustrate three consecutive alternating voltage polarity actuations of zipper switch 100. A first actuation 415 of zipper switch 100 is induced by application of actuation voltage $V_A$ to actuation electrode 110 while cantilever electrode 105 remains grounded. A second actuation 420 of zipper switch 100 is induced by application of actuation voltage $V_A$ to cantilever electrode 105 while actuation electrode 110 remains grounded. A third actuation 425 repeats the first actuation instance 415.

Accordingly, line graph 410C illustrates the potential difference between actuation electrode 110 and cantilever electrode 105. Over many cycles, the actuation voltage between the two electrodes will have a net zero DC component. Use of alternating polarity actuations of zipper switch 100 may be more desirable when higher actuation voltages $V_A$ are used (e.g., >10V).

Figure 3A:
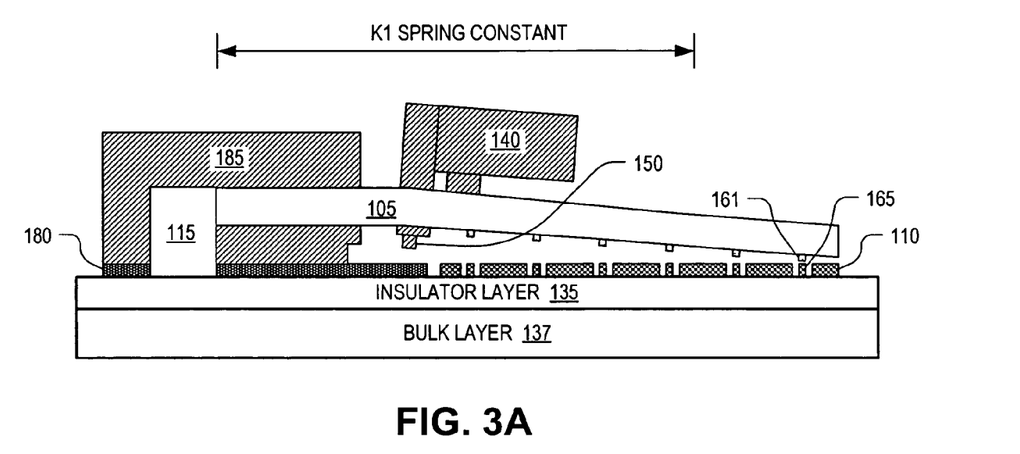
FIG. 3A is a schematic diagram illustrating a first bending phase of a zipper switch in an open circuit position, in accordance with an embodiment of the invention.

Returning to process 200, in a process block 215, the application of the actuation voltage across cantilever electrode 105 and actuation electrode 110 induces cantilever electrode 105 to bend or electrostatically collapse toward actuation electrode 110. This initial bending phase is illustrated in FIG. 3A. As illustrated, the actuation voltage is sufficient to cause distal end 190 of cantilever electrode 105 to collapse to a point where the furthest most stopper stub 161 mates with the furthest most stopper butt 165. The actuation voltage is sufficient to overcome the initial restoring force produced by cantilever electrode 105 having a first spring constant K1. The restoring force of cantilever electrode 105 is weakest during this initial bending phase due to the mechanical advantage provided by the lever arm between distal end 190 and anchors 115. It should be noted that during this initial bending phase, protruding contacts 150 have not yet formed a closed circuit between signal lines 125 and 127.

Figure 3B:
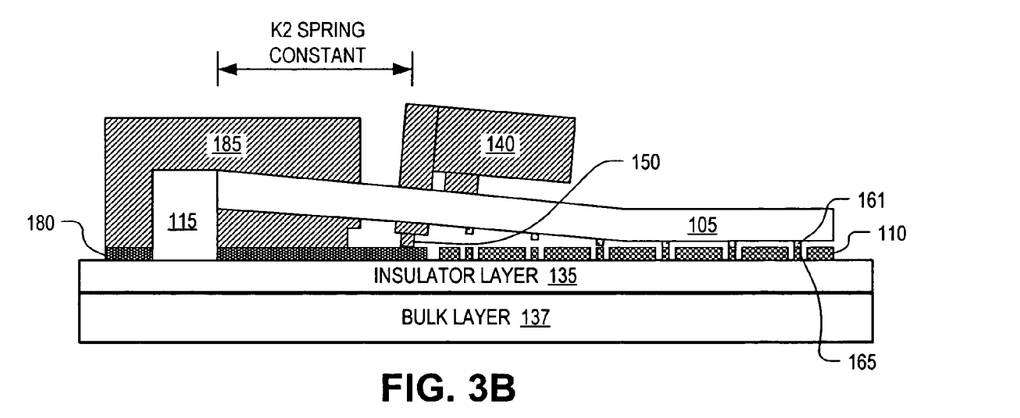
FIG. 3B is a schematic diagram illustrating a second bending phase of a zipper switch in a closed circuit position, in accordance with an embodiment of the invention.

In a process block 220, zipper switch 100 enters a second bending phase illustrated in FIG. 3B. Between the point at which distal end 190 make physical contact with one of stopper butts 165 and zipper switch 100 becomes closed circuited, the restoring force resisting the electrostatic collapsing force increases proportional to a second larger spring constant K2. It should be understood that cantilever electrode 105 may not have only two abrupt spring constants K1 and K2, but rather K1 and K2 represent smallest and largest spring constants, respectively, generated by cantilever electrode 105 during the course of one switching cycle. During this second bending phase, cantilever electrode 105 begins to collapse inward with a "zipper-like" movement starting at distal end 190 moving towards anchors 115 until protruding electrodes 150 contact bottom electrode 180 forming a closed circuit. As the zipper-like collapsing action continues, the restoring force generated by cantilever electrode 105 increases. However, as cantilever electrode 105 continues to collapse onto stopper butts 165 the separation distance between the cantilever electrode 105 and actuation electrode 110 decreases, resulting in a corresponding drastic increase in the electrostatic collapsing force. This drastic increase in the electrostatic collapsing force is sufficient overcome the increasingly strong restoring force proportional to the larger spring constant K2 of cantilever electrode 105. Accordingly, ultra-low actuation voltages equal to digital logic level voltages (e.g., 3.3V or less) can be reliably achieved with embodiments of the invention.

Once zipper switch 100 is closed circuited, the RF signal can propogate through contact 120 and out output signal line 127 (process block 225). To open circuit zipper switch 100, the actuation voltage is removed (process block 230). Upon removal of the actuation voltage, the electrostatic collapsing force relents, and cantilever electrode 105 restores itself to an open circuit position. Initially, stronger spring constant K2 overcomes contact stiction to restore zipper switch 100 to the position illustrated in FIG. 3A, at which point zipper switch 100 is in deed open circuited (process block 235). Subsequently, a weaker restoring force proportional to the spring constant K1 returns zipper switch 100 to the fully restored position illustrated in FIGS. 1A and 1B (process block 240).

However, if distal end 190 sticks in the bent position illustrated in FIG. 3A, zipper switch 100 is still open circuited since contact 120 is not touching bottom electrode 180. Therefore, even if stiction does prevent cantilever electrode 105 from returning to its fully restored position, zipper switch 100 will still continue to correctly function as a electromechanical switch. It should be noted that in an embodiment where cantilever electrode 105 is fabricated of polysilicon, the relative hardness of polysilicon over traditional metal cantilevers lends itself to reduced incidence of stiction.

Due to the zipper-like action of zipper switch 100, less wind resistance is generated by cantilever electrode 105 while switching, when compared to the flapping motion generated by traditional electromechanical switches. Accordingly, zipper switch 100 is well suited for high-speed switch applications, as well as, for low-speed applications. In one embodiment, the greater the actuation voltage the faster the zipper-like switch motion.

Figure 5:
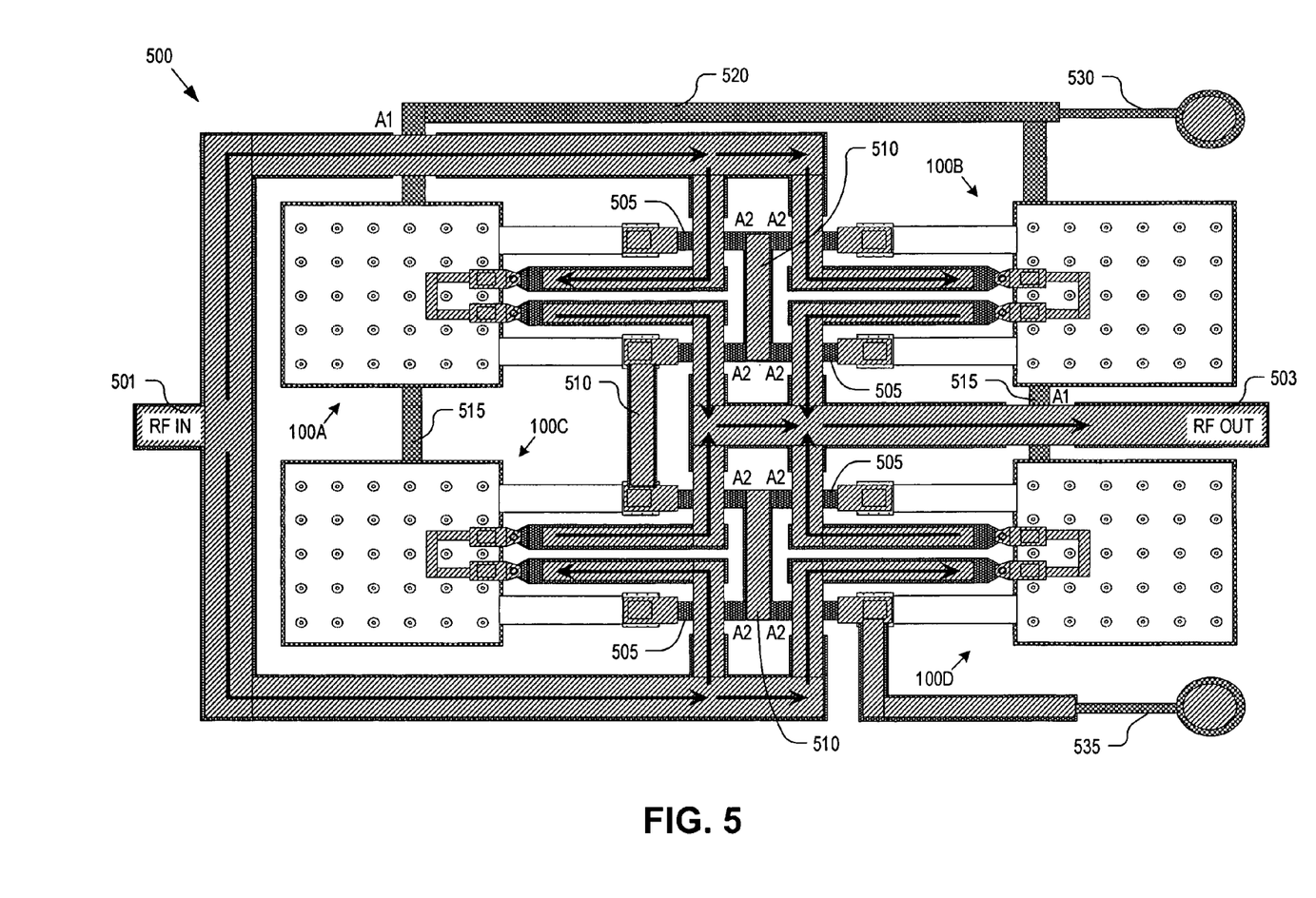
FIG. 5 is a schematic diagram illustrating a single-pole-single-throw switch module using parallel coupled zipper switches, in accordance with an embodiment of the invention.

FIG. 5 is a schematic diagram illustrating a single-pole-single-throw ("SPST") switch module 500 using parallel coupled zipper switches 10A-D, in accordance with an embodiment of the invention. Although FIG. 5 illustrates four interconnected zipper switches, embodiments of the invention are not limited in this manner. Zipper switches 100A-D are similar to zipper switch 100 illustrated in FIGS. 1A and 1B. SPST switch module 500 includes a single RF input 501 and a signal RF output 503. RF input 501 couples to each input signal line of zipper switches 100A-D and RF output 503 couples to each output signal line of zipper switches 100A-D. Coupling zipper switches 100 in parallel reduces the resistance of the RF path (resulting in a lower RF insertion loss) and enables SPST switch module 500 to have a greater power rating than an individual zipper switch 100.

Figure 6:
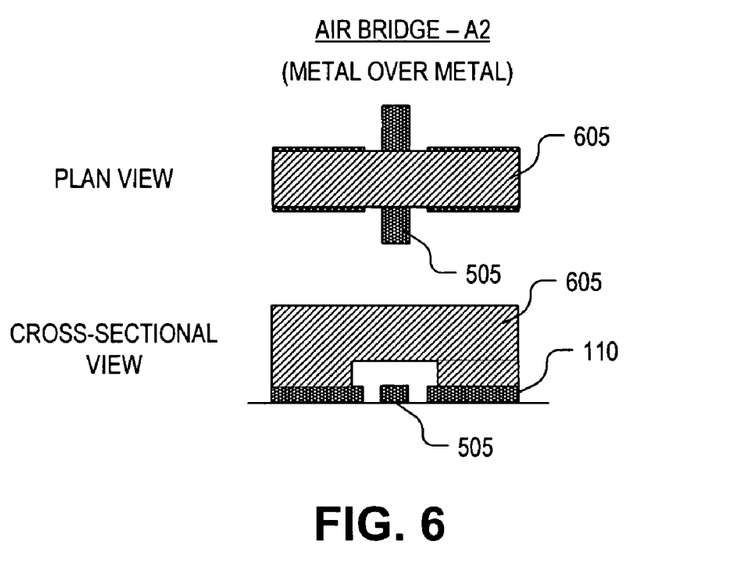
FIG. 6 is a block diagram illustrating cross-sectional and plan views of a metal over metal air bridge, in accordance with an embodiment of the invention.

Zipper switches 100A and 100B are interconnected as a pair of zipper switches 100 coupled in a back-to-back configuration using air bridges A2. Similarly, zipper switches 100C and 100D are interconnected as a pair of zipper switches 100 coupled in a back-to-back configuration also using air bridges A2. Air bridges A2 enable the anchors of each pair of zipper switches 100 to be interconnected back-to-back using conductor lines 505. Cross-interconnects 510 then cross connect the conductor lines 505 of each pair of zipper switches 100 and cross connect one anchor of zipper switch 100A to one anchor of zipper switch 100C, such that all anchors and therefore all cantilever electrodes of zipper switches 100A-D are electrically interconnected. FIG. 6 is a block diagram illustrating cross-sectional and plan views of air bridges A2, in accordance with an embodiment of the invention. In the illustrated embodiment, air bridge A2 is a metal over metal air bridge having an air gap between conductor line 505 and an upper portion 605 of approximately 0.5-2.0 μm. Upper portion 605 represents either one of signal lines 125 or 127, bridging one of conductor lines 505.

Figure 7:
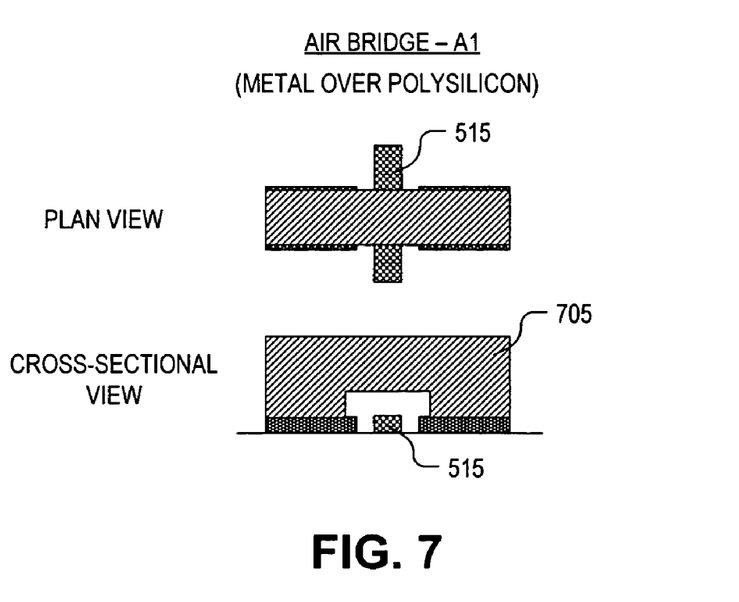
FIG. 7 is a block diagram illustrating cross-sectional and plan views of a metal over polysilicon air bridge, in accordance with an embodiment of the invention.

Returning to FIG. 5, the actuation electrode of zipper switch 100A is coupled to the actuation electrode of zipper switch 100C using a cross-interconnect 515. Similarly, the actuation electrode of zipper switch 100B is coupled to the actuation electrode of zipper switch 100D using another cross-interconnect 515 by way of air bridge A1. In one embodiment, cross-interconnects are fabricated of the same material as the actuation electrodes (e.g., polysilicon). FIG. 7 is a block diagram illustrating cross-sectional and plan views of air bridge A1, in accordance with an embodiment of the invention. In the illustrated embodiment, air bridge A1 is a metal (e.g., gold) over polysilicon air bridge. Upper portion 705 represents RF out 503 bridging one of cross-interconnects 515. Again returning to FIG. 5, the actuation electrodes of zipper switches 100A and 100B are coupled together using an interconnect 520. In one embodiment, interconnect 520 is fabricated of the same material as the actuation electrodes (e.g., polysilicon). Accordingly, the actuation electrodes of all zipper switches 100A-D are electrically interconnected.

Resistors 530 and 535 are coupled to the input ports of each switch electrode (i.e., both the actuation electrodes and the cantilever electrodes) to filter RF noise that couples from the RF paths onto the switching electrodes (i.e., cantilever electrode and actuation electrode). In the illustrated embodiment, resistor 530 couples to interconnect 520, which in turn couples to the input ports (e.g., input port 170 illustrated in FIG. 1A) of zipper switches 100A and 10B. In the illustrated embodiment, resistor 535 couples to one of the anchors of zipper switch 100D used to bias all of the cantilever electrodes of SPST switch module 500. In one embodiment, resistors 530 and 535 are approximately 70 kΩ.

Figure 8A:
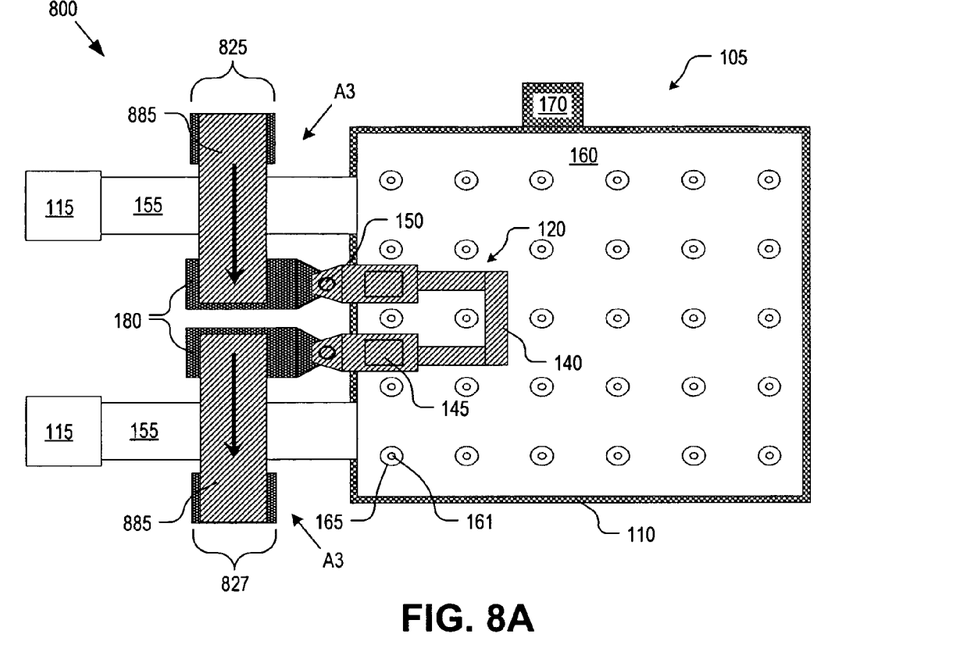
FIG. 8A is a schematic diagram illustrating a plan view of zipper switch with an alternative RF trace design, in accordance with an embodiment of the invention.
Figure 8B:
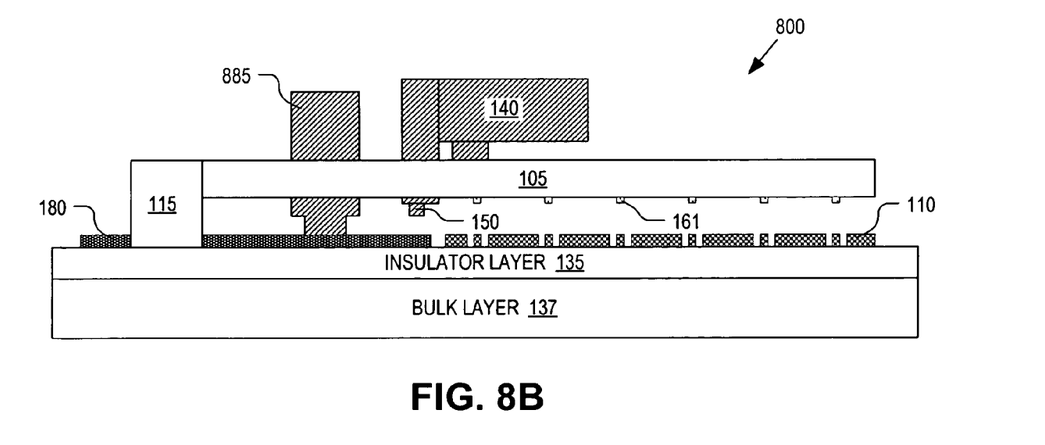
FIG. 8B is a schematic diagram illustrating a cross-sectional view of zipper switch with an alternative RF trace design, in accordance with an embodiment of the invention.

FIGS. 8A and 8B are schematic diagrams illustrating a zipper switch 800, in accordance with an embodiment of the invention. FIG. 8A is a plan view of zipper switch 800 while FIG. 8B is a cross-sectional view of the same. Zipper switch 800 is similar to zipper switch 100 with the exception that input signal line 825 and output signal line 827 are routed over narrow members 155 of cantilever electrode 105. This rerouting of the RF paths avoids lengthy close proximity parallel runs of the RF paths (signal lines 825 and 827), which can cause parasitic inductances and capacitances between the RF traces themselves. Note, signal coupling via the parasitic capacitances between the RF traces and the actuation electrodes is filtered out by resistors 530 and 535.

Figure 10:
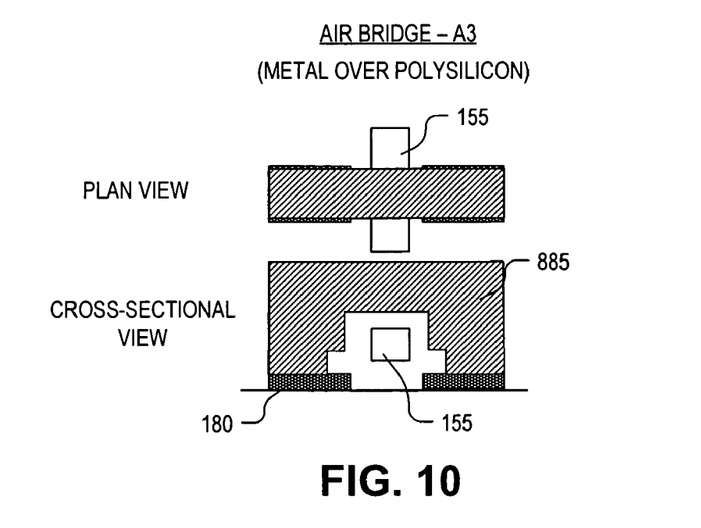
FIG. 10 is a block diagram illustrating cross-sectional and plan views of a metal over polysilicon air bridge, in accordance with an embodiment of the invention.

Signal lines 825 and 827 are routed over narrow members 155 of cantilever electrode 105 using air bridges A3. FIG. 10 is a block diagram illustrating cross-sectional and plan views of air bridges A3, in accordance with an embodiment of the invention. As illustrated, upper layer 885 of one of signal lines 825 and 827 forms an air bridge over narrow member 155 of cantilever electrode 105. In one embodiment, upper layer 885 is fabricated of metal, such as gold (Au).

Figure 9:
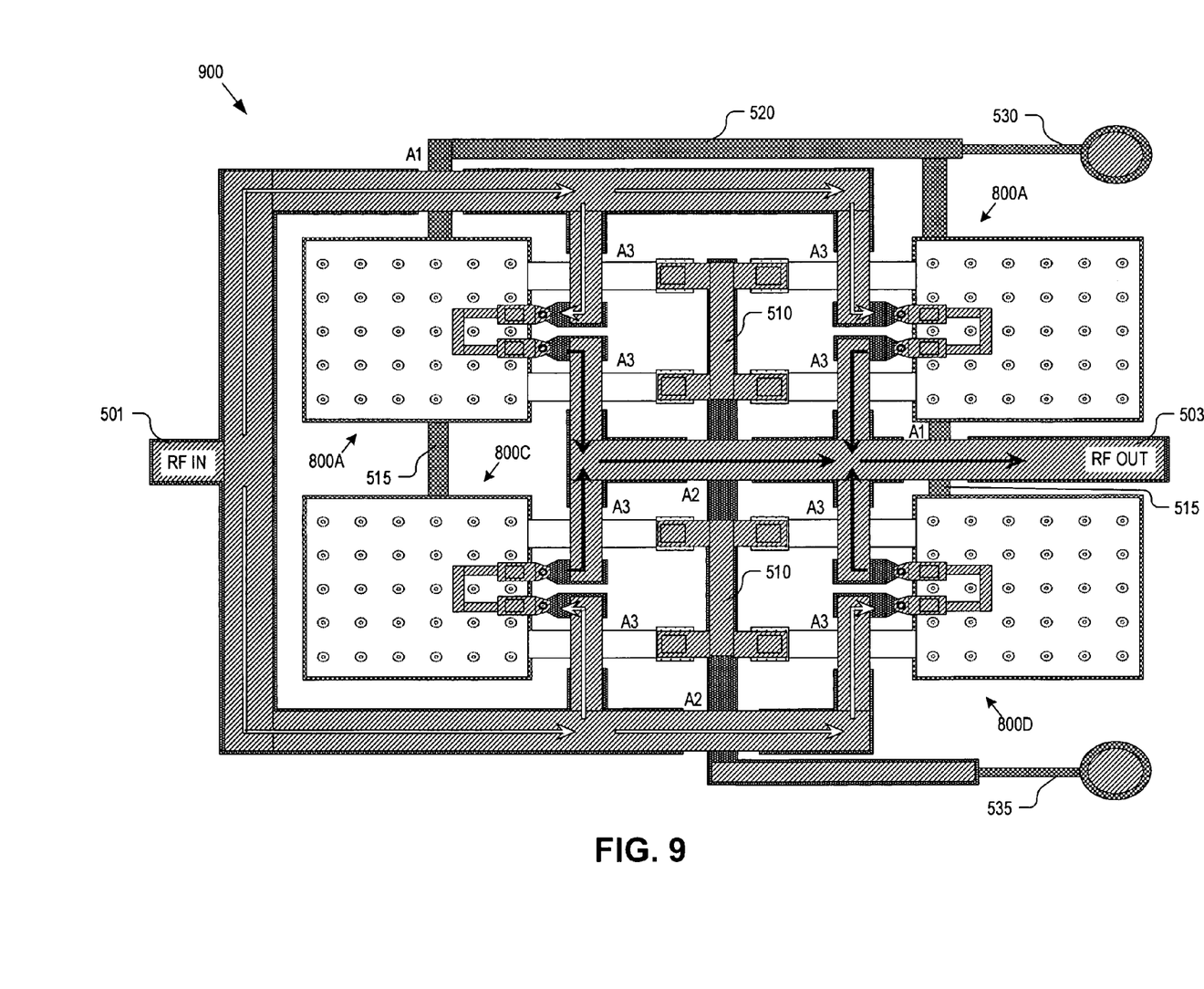
FIG. 9 is a schematic diagram illustrating a single-pole-single-throw switch module using parallel coupled zipper switches implemented with an alternative RF trace design to reduce parasitic RF coupling, in accordance with an embodiment of the invention.

FIG. 9 is a schematic diagram illustrating a SPST switch module 900 using parallel coupled zipper switches 800A-D, in accordance with an embodiment of the invention. Zipper switches 800A-D are similar to zipper switch 800 illustrated in FIGS. 8A and 8B. SPST switch module 800 is similar to SPST switch module 500 in that SPST switch module 800 includes the single RF input 501 and the signal RF output 503 and zipper switches 800A and 800B are coupled back-to-back and zipper switches 800C and 800D are coupled back-to-back. However, using air bridges A3, parallel RF paths are routed further apart. SPST switch module 800 should achieve better high frequency operation when compared to SPST switch module 500. SPST switch module 800 has less potential to introduce undesirable parasitic inductances and capacitance at high frequency operation between the input and output RF paths. Less parasitic inductances and capacitances result in better switch isolation and lower insertion loss.

Figure 11:
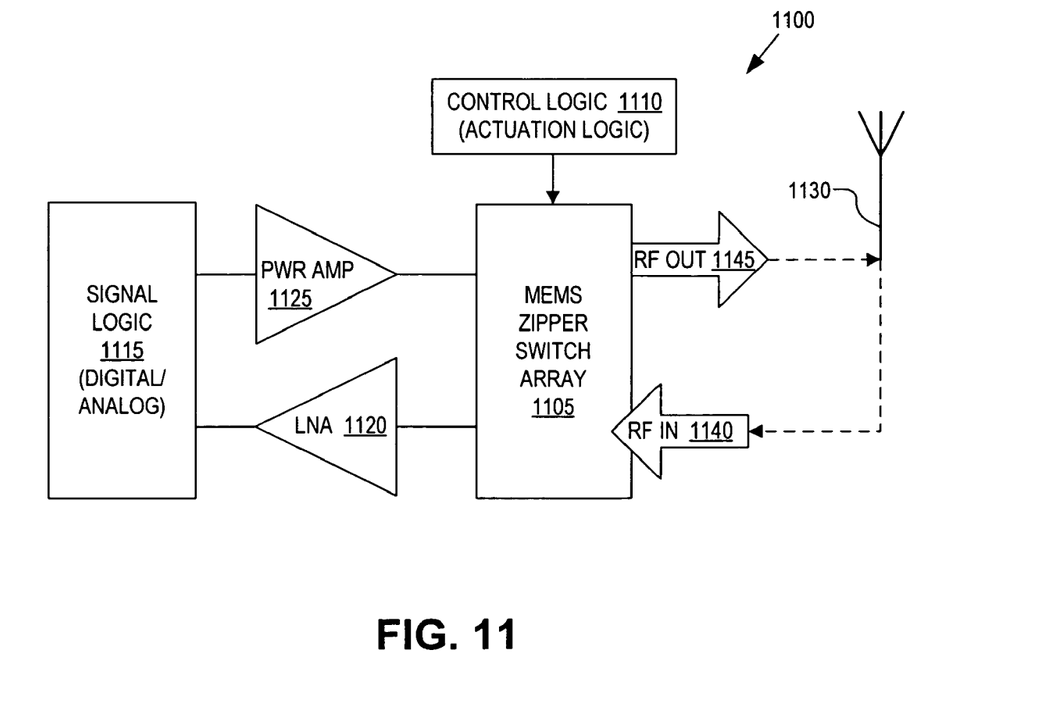
FIG. 11 is a functional block diagram illustrating a demonstrative wireless device implemented with a MEMS zipper switch array, in accordance with an embodiment of the invention.

FIG. 11 is a functional block diagram illustrating a demonstrative wireless device 1100 implemented with a MEMS zipper switch array, in accordance with an embodiment of the invention. Wireless device 1100 may represent any wireless communication device including a wireless access point, a wireless computing device, a cell phone, a pager, a two-way radio, a radar system, and the like.

The illustrated embodiment of wireless device 1100 includes a MEMS zipper switch array 1105, control logic 1110, signal logic 1115, a low noise amplifier ("LNA") 1120, a power amplifier 1125, and an antenna 1130. MEMS zipper switch array 1105 may include one or more zipper switches 100, one or more zipper switches 800, one or more SPST switch modules 500, and/or one or more SPST switch modules 800. All or some of the components of wireless device 1100 may or may not be integrated into a single semiconductor substrate (e.g., silicon substrate).

Control logic 1110 may also be referred to as the actuation logic and is responsible for applying the actuation voltage for switching on/off the zipper switches within MEMS zipper switch array 1105. Control logic 1110 couples to actuation electrode 110 and/or cantilever electrode 105 of each zipper switch within MEMS zipper switch array 1105. Since the zipper switches described herein are capable of ultra-low voltage actuation (e.g., <3.0V), control logic 1110 may use logic level voltages (e.g., 3.3 V) to actuate MEMS zipper switch array 1105. In one embodiment, the same logic level voltage used by control logic 1110 and/or signal logic 1115 to switch transistors therein is also used to switch the zipper switches of MEMS zipper switch array 1105.

During a receive operation, control logic 1110 applies the actuation voltage to those zipper switches coupled to RF input 1140 such that an RF signal propagates through MEMS zipper switch array 1105 to LNA 1120 from antenna 1130. LNA 1120 amplifies the RF signal and provides it to signal logic 1115. Signal logic 1115 may include analog-to-digital converters to convert the RF signal to a digital signal and further include logic elements to process the digital signal. During a transmit operation, control logic 1110 applies the actuation voltage to those zipper switches coupled to RF output 1145 such that an RF signal propagates through MEMS zipper switch array 1105 to antenna 1130 from power amplifier 1125. Signal logic 1115 may further include logic to generate a digital signal and a digital-to-analog converter to convert the digital signal to an RF signal.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. An apparatus, comprising:
   an actuation electrode mounted to a substrate;
   an anchor mounted to the substrate;
   a cantilever electrode supported by the anchor proximate the actuation electrode;
   a contact mounted to the cantilever electrode and protruding below the cantilever electrode between the anchor and a middle of the cantilever electrode; and
   signal lines positioned to form a closed circuit with the contact when an actuation voltage is applied between the actuation electrode and the cantilever electrode causing the cantilever electrode to bend towards the actuation electrode in a progressive movement starting from a distal end of the cantilever electrode.

2. The apparatus of claim 1, wherein the cantilever electrode comprises polysilicon.

3. The apparatus of claim 2, wherein the cantilever electrode includes multiple spring constants, a first of the multiple spring constants to provide a first restoring force to open circuit the signal lines with the contact when the actuation voltage is removed and a second of the multiple spring constants to provide a second restoring force smaller than the first restoring force to separate the distal end of the cantilever electrode from the actuation electrode after the actuation voltage is removed.

4. The apparatus of claim 2, further comprising a plurality of stopper stubs formed on an underside of the cantilever electrode to prevent the cantilever electrode from electrically contacting the actuation electrode when the actuation voltage is applied.

5. The apparatus of claim 4, further comprising stopper butts disposed within the actuation electrode but electrically insulated from the actuation electrode, the stopper butts positioned to abut the stopper stubs when the cantilever electrode bends towards the actuation electrode.

6. The apparatus of claim 1, further comprising another anchor and wherein the cantilever electrode comprises two narrow members coupled to a plate member at first ends and mounted to the anchors at opposite ends, wherein the contact comprises two protruding contacts extending below the cantilever electrode and interconnected above the cantilever electrode by a suspended trace.

7. The apparatus of claim 1, wherein the apparatus comprises a micro-electromechanical system ("MEMS") radio frequency ("RF") switch and wherein the signal lines comprise:
   an input RF signal line to carry an RF signal into the MEMS RF switch; and
   an output RF signal line to carry the RF signal out of the MEMS RF switch.

8. The apparatus of claim 1, wherein the substrate comprises an insulating layer disposed over a bulk silicon layer, wherein the actuation electrode, the anchor, and the signal lines are disposed on the insulating layer.

9. The apparatus of claim 1, wherein the apparatus comprises a switch module including four micro-electromechanical system ("MEMS") switches coupled in parallel, each of the MEMS switches including the actuation electrode, the anchor, and the signal lines mounted to the substrate and the cantilever electrode supported by the anchor, wherein the switch module further comprises:
   first interconnects electrically interconnecting the actuation electrode of each of the MEMS switches;
   second interconnects electrically interconnecting the anchor of a first and a second pair of the MEMS switches in a back-to-back configuration; and
   cross-interconnects electrically interconnecting the anchor of one of the MEMS switches of the first pair to the anchor of one of the MEMS switches of the second pair such that the anchor of all four MEMS switches are electrically interconnected.

10. The apparatus of claim 9, wherein each of the second interconnects comprises a metal air bridge over a metal conductor line, the metal air bride coupling to one of the signal lines and the metal conductor line coupling to the anchor.

11. The apparatus of claim 9, further comprising:
a first resistor electrically coupled at a first input port of the actuation electrode of one of the MEMS switches to filter RF signal loss through the actuation electrodes; and
a second resistor electrically coupled a second input port coupled to the cantilever electrode of one of the MEMS switches to filter RF signal loss through the cantilever electrode.

12. The apparatus of claim 1, wherein the progressive movement comprises a zipper like movement that starts from the distal end of the cantilever electrode and progressively moves towards the anchor.

13. A method of operating an electromechanical switch, comprising:
propagating an radio frequency ("RE") signal along an input signal line;
applying an actuation voltage, between an actuation electrode and a cantilever electrode suspended above the actuation electrode by an anchor, to bend the cantilever electrode toward the actuation electrode with a zipper like movement starting from a distal end of the cantilever electrode and moving towards the anchor, wherein the actuation voltage is less than approximately 8V;
close circuiting the input signal line with an output signal line through a contact mounted to the actuation electrode while the actuation voltage is applied; and
propagating the RF signal from the input signal line through the contact to the output signal line.

14. The method of claim 13, wherein the contact protrudes below the cantilever electrode and is mounted to the cantilever electrode between the anchor and a middle of the cantilever electrode, and wherein the cantilever electrode comprises polysilicon.

15. The method of claim 13, wherein the actuation voltage comprises a digital logic level voltage.

16. The method of claim 13, wherein the RF signal is decoupled from the actuation voltage.

17. The method of claim 16, wherein the actuation voltage is applied between the actuation electrode and the cantilever electrode with alternating polarity between instances of close circuiting the input signal line with the output signal line.

18. A wireless device, comprising:
an amplifier;
an antenna; and
a micro-electromechanical system ("MEMS") switch including:
an actuation electrode mounted to a substrate;
an anchor mounted to the substrate;
a cantilever electrode supported by the anchor above the actuation electrode;
a contact mounted to the cantilever electrode between the anchor and a center of the cantilever electrode, the contact protruding below the cantilever electrode;
an input signal line mounted to the substrate and coupled to the antenna; and
an output signal line mounted to the substrate and coupled to the amplifier, the input and output signal lines positioned to form a closed circuit with the contact when an actuation voltage is applied between the actuation electrode and the cantilever electrode causing the cantilever electrode to bend towards the actuation electrode in a zipper like movement starting from a distal end of the cantilever electrode.

19. The wireless device of claim 18, further comprising control logic coupled to apply the actuation voltage between the cantilever and actuation electrodes, the actuation voltage comprises a logic level voltage used by logic elements of the control logic.

20. The wireless device of claim 19, wherein the cantilever electrode comprises polysilicon.

* * * * *

UNITED STATES PATENT AND TRADEMARK OFFICE
CERTIFICATE OF CORRECTION

PATENT NO. : 7,321,275 B2 Page 1 of 1
APPLICATION NO. : 11/165795
DATED : January 22, 2008
INVENTOR(S) : Chou et al.

It is certified that error appears in the above-identified patent and that said Letters Patent is hereby corrected as shown below:

In column 4, at line 5, delete first occurrence of "LAG", and insert --LSG--.

In column 4, at line 5, delete second occurrence of "LAG", and insert --LSG--.

In column 4, at line 56, delete "LAG", and insert --LSG--.

In column 7, at line 22, delete "10A-D,", and insert --100A-D,--.

In column 8, at line 16, delete "10B", and insert --100B--.

Signed and Sealed this

Twenty-sixth Day of August, 2008

JON W. DUDAS
*Director of the United States Patent and Trademark Office*